(12) United States Patent
Takeuchi

(10) Patent No.: US 7,129,148 B2
(45) Date of Patent: Oct. 31, 2006

(54) METHODS FOR MANUFACTURING SEMICONDUCTOR DEVICES AND SEMICONDUCTOR DEVICES HAVING TRENCH ISOLATION REGIONS

(75) Inventor: Masahiro Takeuchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 09/930,365

(22) Filed: Aug. 15, 2001

(65) Prior Publication Data
US 2002/0055216 A1 May 9, 2002

(30) Foreign Application Priority Data
Aug. 15, 2000 (JP) ............... 2000-246215

(51) Int. Cl.
*H01L 21/76* (2006.01)
*H01L 21/8238* (2006.01)
*H01L 21/336* (2006.01)

(52) U.S. Cl. .............. 438/424; 438/221; 438/296

(58) Field of Classification Search ........ 257/356–358, 257/364, 369, 371, 374, 506, 507, 508, 509, 257/510; 438/196, 207, 218, 219, 221, 295, 438/296, 359, 404, 284, 424, 425, 427
See application file for complete search history.

(56) References Cited

U.S. PATENT DOCUMENTS

| 5,801,083 | A | * | 9/1998 | Yu et al. ............... 438/424 |
| 5,950,090 | A | * | 9/1999 | Chen et al. ............. 438/296 |
| 5,966,614 | A |   | 10/1999 | Park et al. |
| 5,989,997 | A | * | 11/1999 | Wu ....................... 438/424 |
| 6,028,339 | A | * | 2/2000 | Frenette et al. ......... 257/364 |
| 6,051,480 | A | * | 4/2000 | Moore et al. ........... 438/435 |
| 6,064,105 | A | * | 5/2000 | Li et al. ............... 257/510 |
| 6,069,058 | A | * | 5/2000 | Hong ..................... 438/436 |
| 6,087,243 | A | * | 7/2000 | Wang .................... 438/424 |
| 6,165,854 | A | * | 12/2000 | Wu ....................... 438/296 |
| 6,258,692 | B1 | * | 7/2001 | Chu et al. .............. 438/400 |
| 6,265,269 | B1 | * | 7/2001 | Chen et al. ............. 438/270 |
| 6,303,432 | B1 | * | 10/2001 | Horita et al. ........... 438/253 |
| 6,323,106 | B1 | * | 11/2001 | Huang et al. ........... 438/433 |
| 6,362,035 | B1 | * | 3/2002 | Shih et al. ............. 438/199 |
| 6,372,606 | B1 | * | 4/2002 | Oh ...................... 438/424 |
| 6,380,047 | B1 | * | 4/2002 | Bandyopadhyay et al. . 438/427 |
| 6,548,373 | B1 | * | 4/2003 | Chuang et al. .......... 438/424 |

FOREIGN PATENT DOCUMENTS

| JP | 04-68564 | * | 3/1992 | ............... 27/92 |
| JP | 09-205140 |   | 8/1997 | |
| JP | 10-189708 |   | 7/1998 | |
| JP | 11-054605 |   | 2/1999 | |
| JP | 2000-208609 |   | 7/2000 | |
| JP | 2001-352042 |   | 12/2001 | |

* cited by examiner

Primary Examiner—Shouxiang Hu
(74) Attorney, Agent, or Firm—Konrad, Raynes & Victor, LLP; Alan S. Raynes

(57) ABSTRACT

A semiconductor device having trench isolation regions in which leaks are suppressed may be formed using the following steps. (a) Forming a trench 32 in a semiconductor layer 12; (b) forming a dielectric layer 40 that fills the trench 32; and (c) conducting a thermal treatment of the dielectric layer 40, wherein the thermal treatment is conducted at temperatures of 1050° C. or higher.

12 Claims, 9 Drawing Sheets

METHODS FOR MANUFACTURING SEMICONDUCTOR DEVICES AND SEMICONDUCTOR DEVICES HAVING TRENCH ISOLATION REGIONS

Applicants hereby incorporate by reference Japanese Application No. 2000-246215, filed Aug. 15, 2000, in its entirety.

TECHNICAL FIELD

The present invention relates to methods for manufacturing semiconductor devices and semiconductor devices, and more particularly to methods for manufacturing semiconductor devices and semiconductor devices having element isolation regions.

BACKGROUND

With further miniaturization of semiconductor devices such as MOS transistors in recent years, element isolation regions need to be further miniaturized. To achieve further miniaturization of element isolation regions, a trench element isolation technique is considered. According to the trench element isolation technique, trenches are provided in a substrate between semiconductor elements, and dielectric material is filled in the trenches to isolate the semiconductor elements from one another.

SUMMARY

Certain embodiments of the present invention relate to methods for manufacturing semiconductor devices and semiconductor devices having element isolation regions in which leaks are suppressed.

Embodiments include a method for manufacturing a semiconductor device having a trench isolation region, the method including the steps of (a) forming a trench in a semiconductor layer; (b) forming a dielectric layer that fills the trench; and (c) conducting a thermal treatment of the dielectric layer, wherein the thermal treatment is conducted at temperatures of at least 1050° C. In one aspect of certain embodiments, the method may also include a step (d) of forming a well in the semiconductor layer, where the step (c) is conducted before the step (d). In another aspect of certain embodiments, the trench may be formed to include sidewall surfaces and a bottom surface, and the method may further include thermally oxidizing the sidewall surfaces and the bottom surface of the trench.

Embodiments also include a method for manufacturing a semiconductor device having a trench isolation region, the method including forming a trench in a semiconductor layer. A dielectric layer is formed in the trench. The dielectric layer is heated at a temperature of at least 1050° C. In one aspect of certain embodiments, the heating of the dielectric layer may carried out for a time in the range of 20 to 120 minutes at a temperature in the range of 1050 to 1200° C. In another aspect of certain embodiments, the method also includes forming at least one transistor adjacent to the trench isolation region, the transistor being formed after heating the dielectric layer.

Embodiments also include a method for manufacturing a semiconductor device including a trench isolation region, the method including forming a first layer on a semiconductor substrate and forming a polishing stopper layer above the first layer. At least one trench is formed by etching the first layer while using the polishing stopper layer as a mask. A dielectric layer is formed in and above the trench. The dielectric layer is planarized using the polishing stopper layer as a stopper.

Embodiments also include a semiconductor device including a trench isolation region and transistor element regions, the device including a semiconductor substrate and a first layer formed on the semiconductor substrate. A trench isolation region is formed in the first layer, the trench isolation region including a oxide layer and a dielectric material layer therein. The device also includes transistor element regions separated by the trench isolation region.

Embodiments also include a semiconductor device including a trench isolation region, the device including a semiconductor substrate and an epitaxial growth layer on the semiconductor substrate. A trench is provided in the epitaxial growth layer, and an annealed dielectric layer is provided in the trench. A trench oxide film is formed between the epitaxial growth layer and the dielectric layer. The device also includes transistor element regions separated by the trench isolation region.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
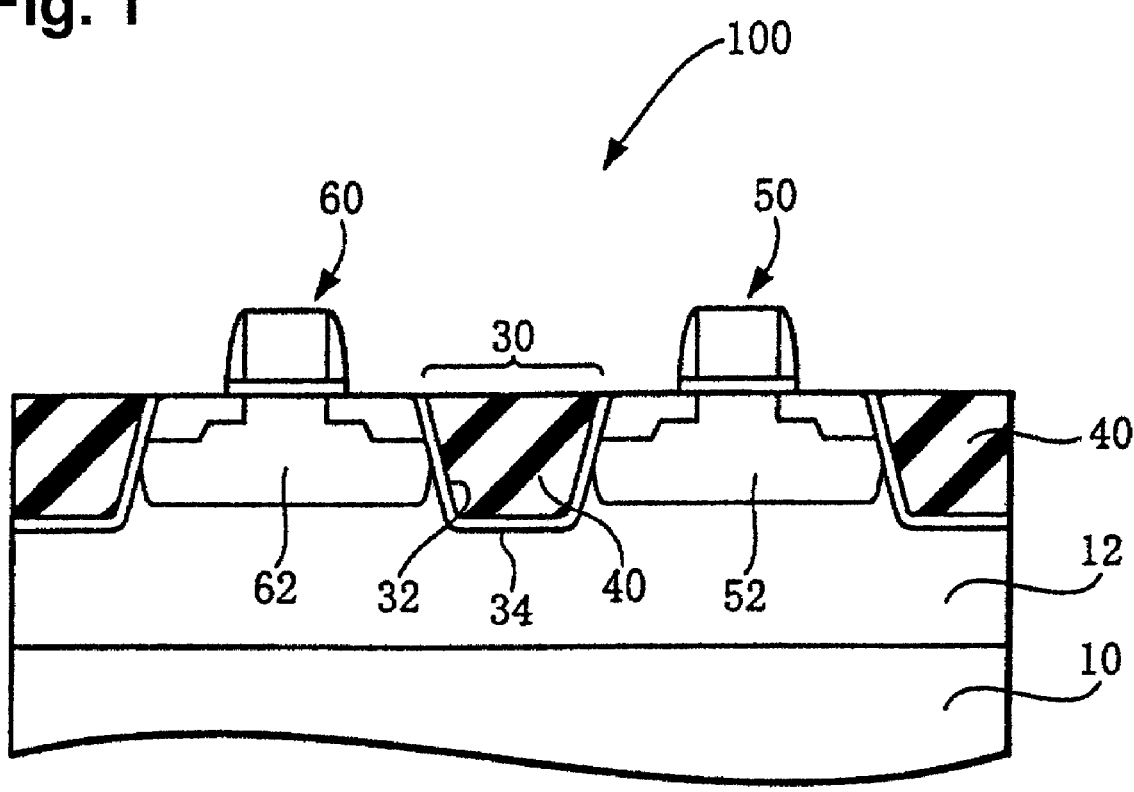
FIG. 1 schematically shows a cross-sectional view of a semiconductor device in accordance with one embodiment of the present invention.
Figure 2:
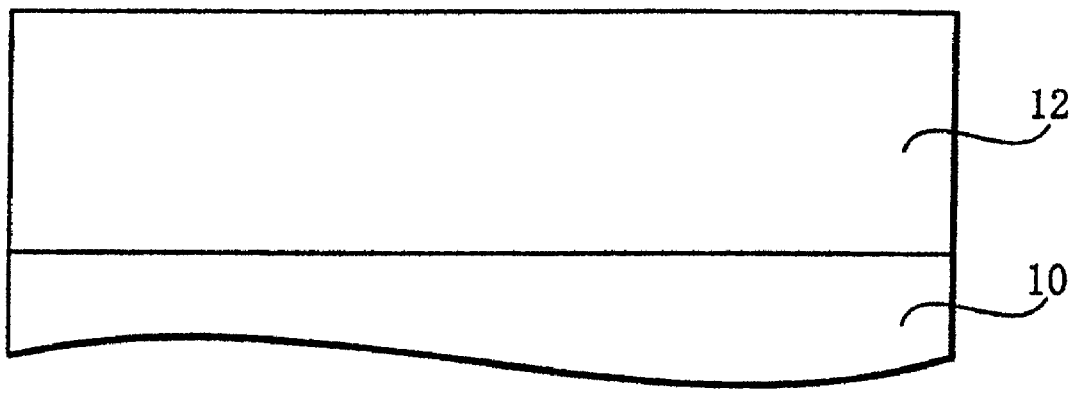
FIG. 2 schematically shows in cross section a step of manufacturing a semiconductor device in accordance with one embodiment of the present invention.
Figure 2:
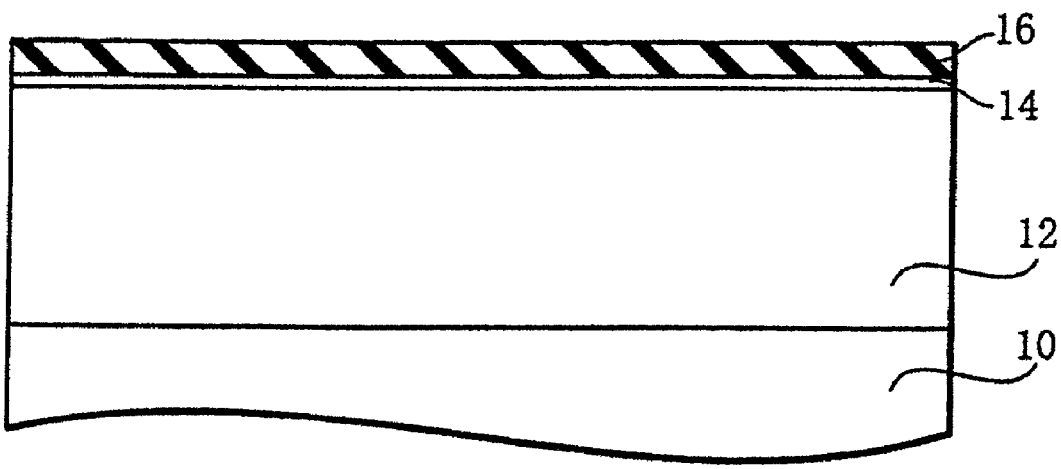
Figure 3:
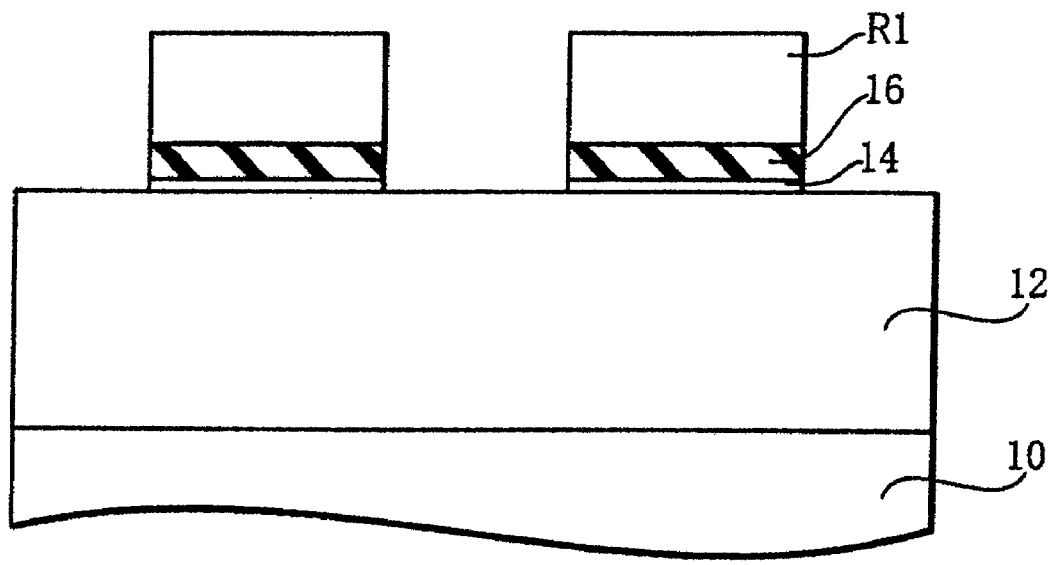
FIG. 3 schematically shows in cross section a step of manufacturing a semiconductor device in accordance with one embodiment of the present invention.
Figure 3:
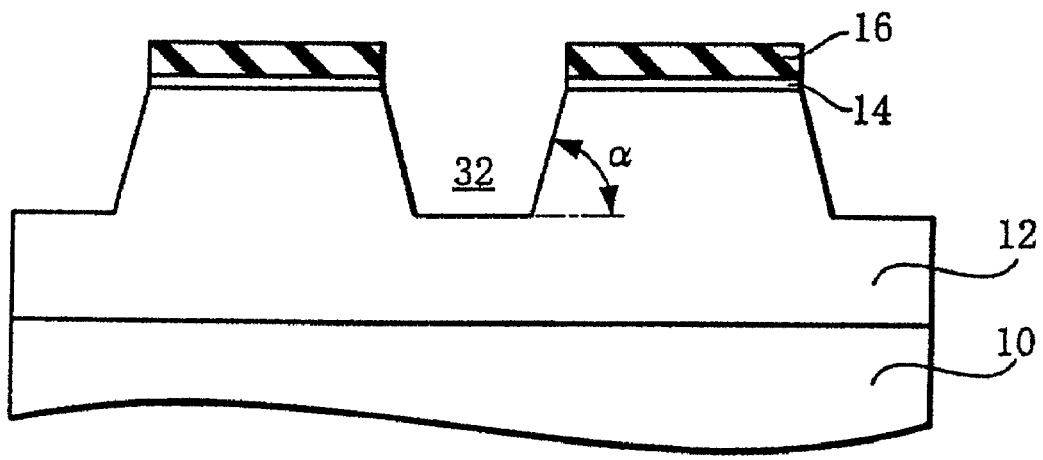
Figure 4:
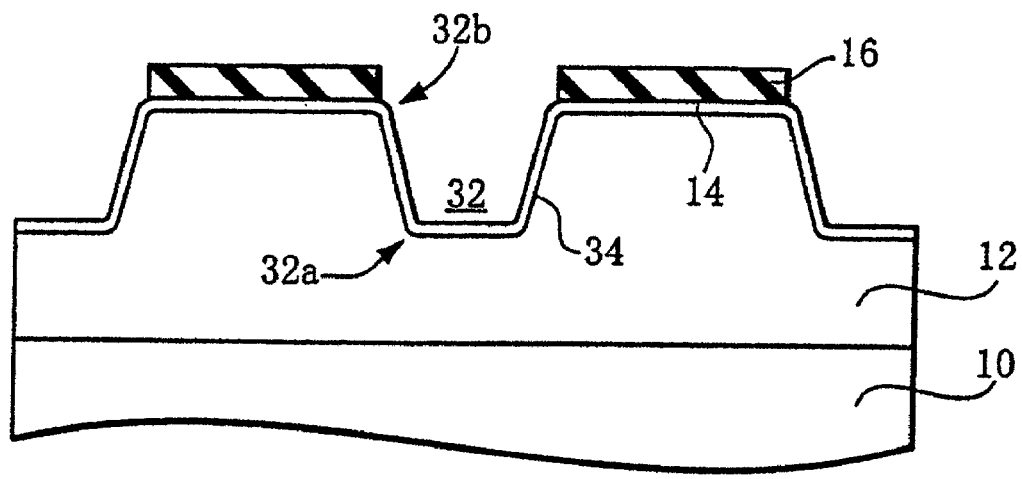
FIG. 4 schematically shows in cross section a step of manufacturing a semiconductor device in accordance with one embodiment of the present invention.
Figure 4:
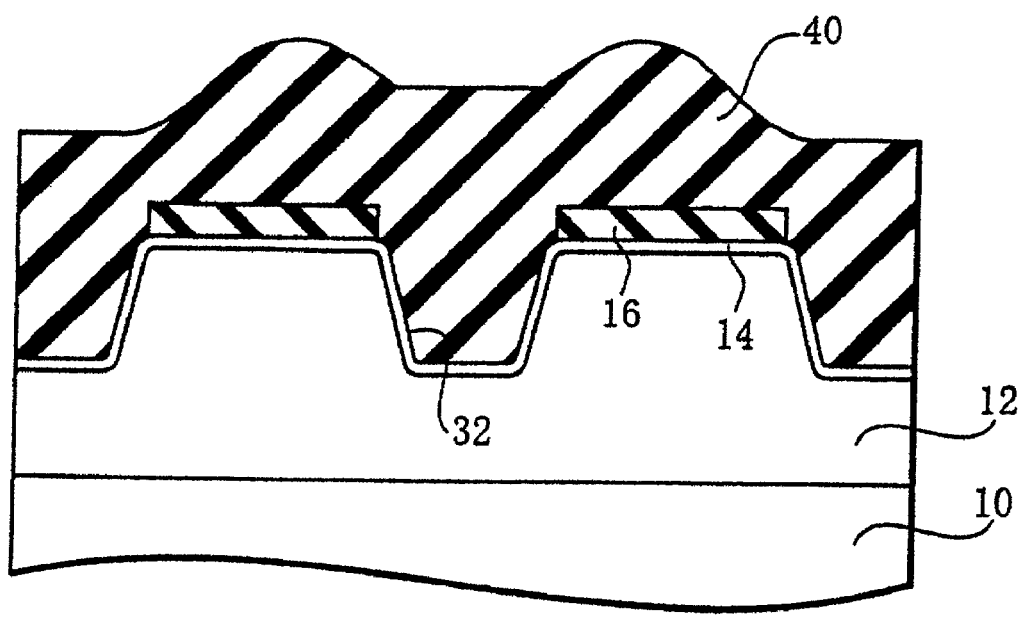
Figure 5:
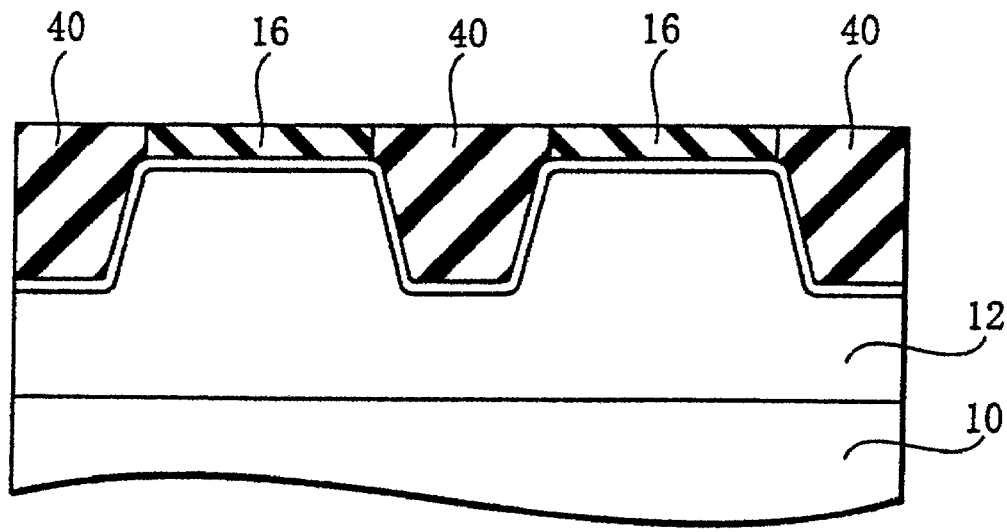
FIG. 5 schematically shows in cross section a step of manufacturing a semiconductor device in accordance with one embodiment of the present invention.
Figure 5:
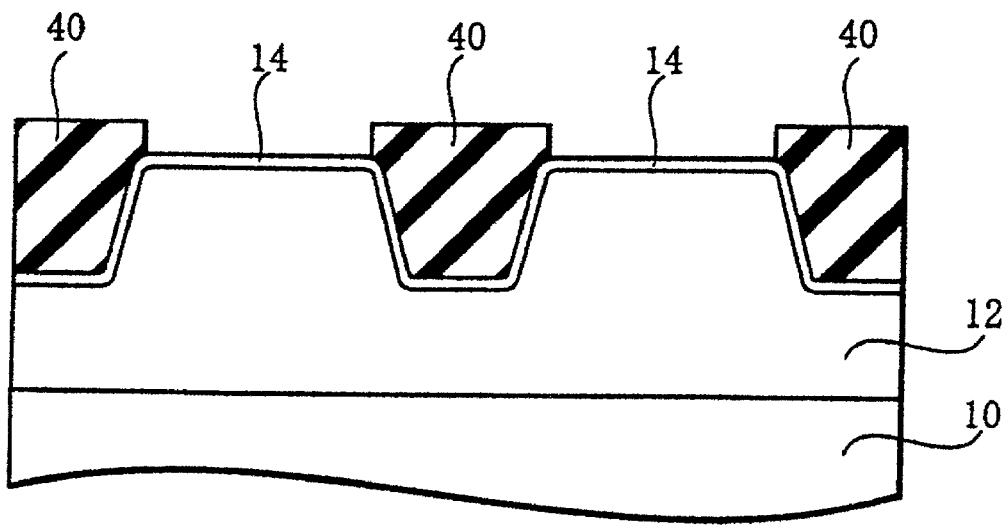
Figure 6:
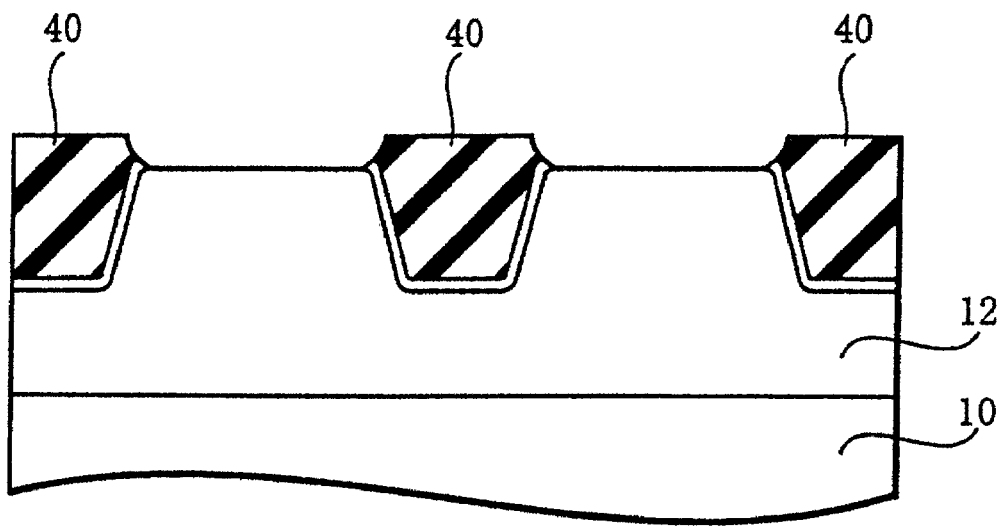
FIG. 6 schematically shows in cross section a step of manufacturing a semiconductor device in accordance with one embodiment of the present invention.
Figure 6:
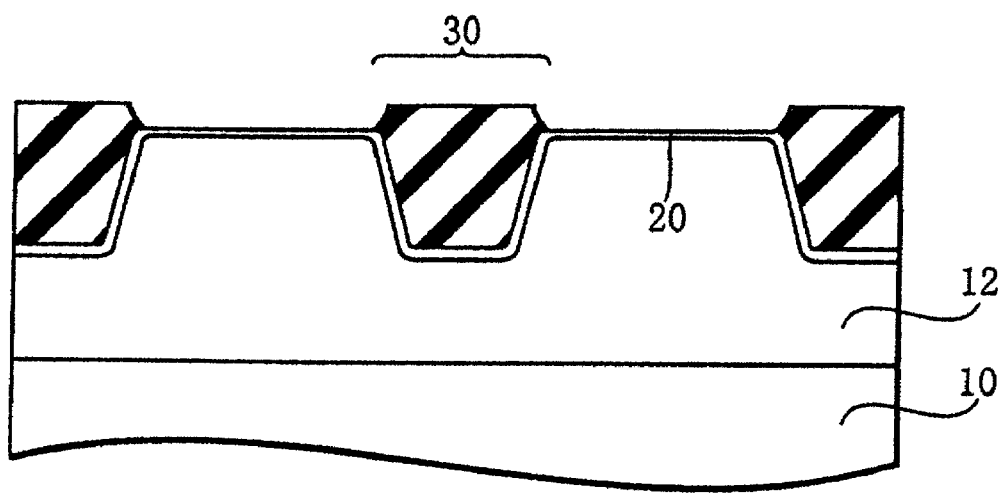
Figure 7:
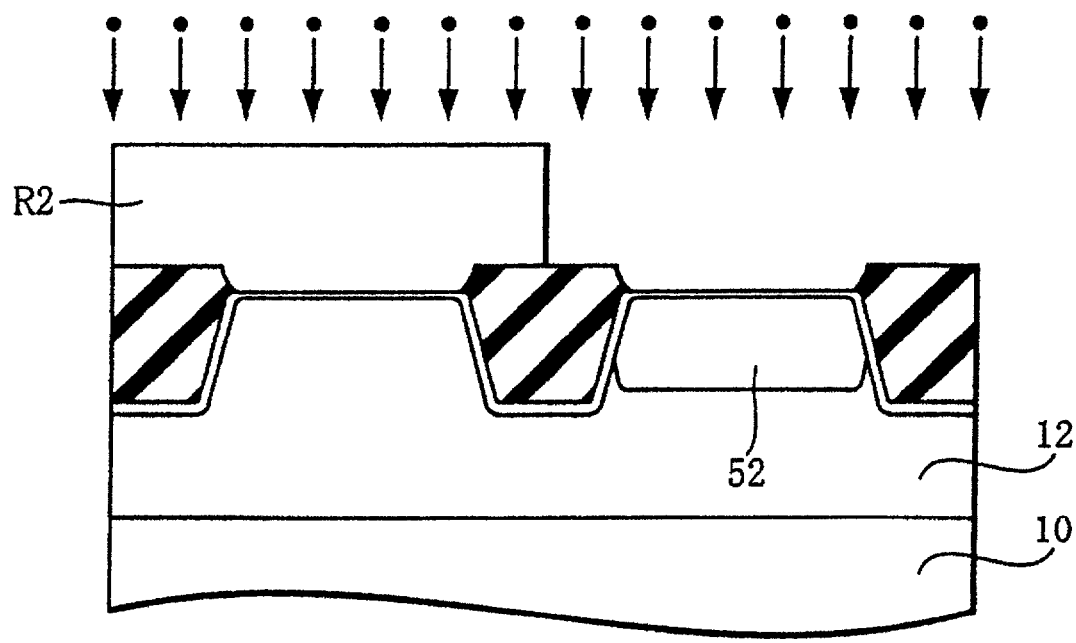
FIG. 7 schematically shows in cross section a step of manufacturing a semiconductor device in accordance with one embodiment of the present invention.
Figure 7:
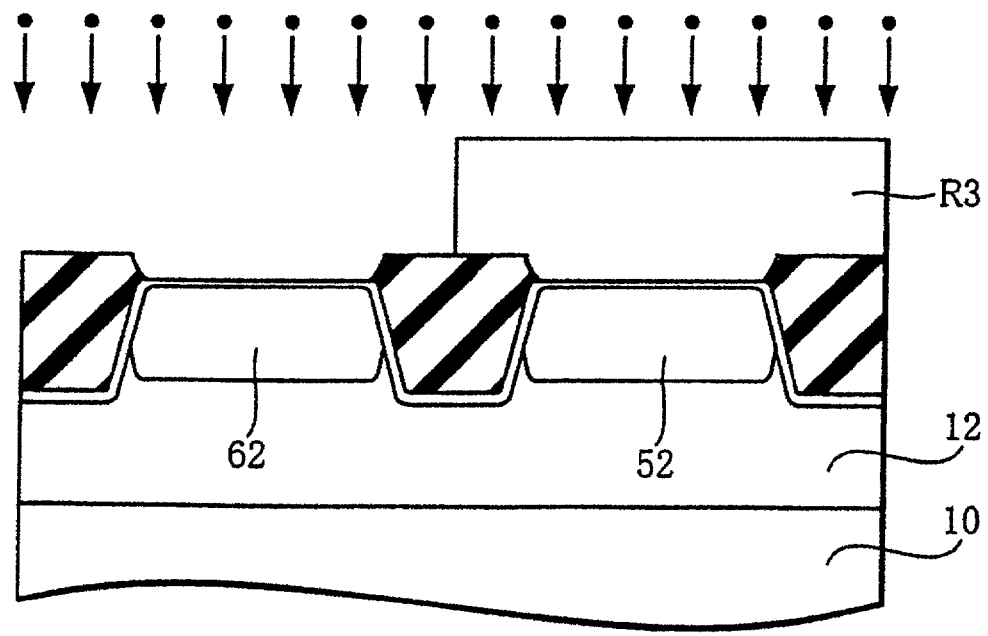

A method for manufacturing a semiconductor device having a trench isolation region in accordance with an embodiment of the present invention comprises the following steps (a)–(c).

(a) Forming a trench in a semiconductor layer;

(b) forming a dielectric layer that fills the trench; and (c) conducting a thermal treatment of the dielectric layer, wherein the thermal treatment is conducted at temperatures of 1050° C. or higher.

In accordance with the present embodiment, in step (c), the dielectric layer is thermally treated at temperatures of 1050° C. or higher. Accordingly, stresses in the dielectric layer can be released. As a result, the generation of cracks in the semiconductor layer can be suppressed, and the generation of leaks is inhibited or suppressed.

The present embodiment may be particularly useful when, in step (b), the dielectric layer is formed with a film density of 2.1 g/cm$^3$ or greater.

The temperature of the thermal treatment (step c) may preferably be 1100° C. or higher. Accordingly, the generation of cracks may be inhibited or prevented. As a result, the generation of leaks is inhibited or suppressed.

The temperature of the thermal treatment (step c) may also preferably be 1250° C. or lower.

It is preferred that the dielectric layer described above be formed by a high-density plasma CVD method. It is noted that the high-density plasma is plasma with its ion density being $1\times10^{11}/cm^3$ or greater.

In certain embodiments, a step (d) of forming a well in the semiconductor layer is included, and in such embodiments step (c) may preferably be conducted before step (d). As a result, thermal diffusion of the well may be inhibited or prevented.

Certain embodiments may also include a step (e) of thermally oxidizing the semiconductor layer in the trench, in other words, sidewall surfaces and the bottom surface of the trench, can be thermally oxidized. By the inclusion of step (e), corner sections and edge sections of the semiconductor layer in the trench can be rounded. The temperature at step (e) may be, for example, at 700–1150° C., and more preferably at 950–1150° C. In these temperature ranges, corner sections and edge sections of the semiconductor layer can be securely rounded.

The semiconductor layer described above may in certain embodiments be an epitaxial growth layer formed on a semiconductor substrate. Such an epitaxial growth layer may preferably have a thickness of 2 μm or greater. As a result, negative influences on the semiconductor elements by diffusion of impurity in the semiconductor substrate can be inhibited or prevented.

Embodiments of the present invention are particularly useful when manufacturing a semiconductor device having a trench with a trench width of 0.35 μm or smaller. It is noted that the trench width is a width of the trench at its upper edge section.

It is noted that the "semiconductor layer" may include, for example, a semiconductor substrate and a semiconductor layer (for example, an epitaxial growth layer) formed on a substrate.

Certain preferred embodiments of the present invention are described below with reference to the accompanying figures.

A semiconductor device in accordance with an embodiment of present invention is described below. FIG. 1 schematically shows a cross-sectional view of a semiconductor device 100 in accordance with this embodiment.

The semiconductor device 100 includes a trench isolation region 30 and MOS transistors 50, 60. A structure of the semiconductor device 100 is as follows.

An epitaxial growth layer 12 is formed on a semiconductor substrate 10. A trench isolation region 30 is formed in the epitaxial growth layer 12. The trench isolation region 30 is formed with a dielectric layer 40 filled in a trench 32 that is provided in the epitaxial growth layer 12. A trench oxide film 34 is formed between the epitaxial growth layer 12 and the dielectric layer 40. The trench isolation region 30 defines element regions.

An n-type well 52 is formed in the epitaxial growth layer 12 in one of the element regions. Also, a p-type well 62 is formed in the epitaxial growth layer 12 in the other of the element regions. A p-type MOS transistor 50 is formed in the element region where the n-type well 52 is formed, and an n-type MOS transistor 60 is formed in the element region where the p-type well 62 is formed.

Next, a method for manufacturing a semiconductor device in accordance with an embodiment of the present invention is described. FIGS. 2 through 8 schematically show cross-sectional views of a semiconductor device 100 in manufacturing steps in accordance with the present embodiment.

First, as shown in FIG. 2(a), a layer such as an epitaxial growth layer 12 is formed on a semiconductor substrate 10. The epitaxial growth layer 12 may be formed by flowing, for example, silane (SiH$_4$) gas, to epitaxially grow silicon on the surface of the semiconductor substrate 10. The epitaxial growth layer 12 may preferably have a thickness of 2 μm or greater, and more preferably 3–10 μm.

Next, as shown in FIG. 2(b), a pad layer 14 is formed on the epitaxial growth layer 12. The material of the pad layer 14 may be, for example, silicon oxide, silicon oxide nitride or the like. When the pad layer 14 is formed from silicon oxide, the pad layer 14 can be formed by a thermal oxidation method or a CVD method. When it is formed from silicon oxide nitride, is can be formed by a CVD method or the like. The pad layer 14 has a thickness of, for example, 5–20 nm.

Then, a polishing stopper layer 16 is formed over the pad layer 14. The polishing stopper layer 16 may be formed from a single layer structure composed of any one of, for example, a silicon nitride layer, a polycrystal silicon layer and an amorphous silicon layer, or a multiple layered structure composed of at least two types of layers selected from, for example, a silicon nitride layer, a polycrystal silicon layer and an amorphous silicon layer. The polishing stopper layer 16 may be formed by a known method, such as a CVD method. The polishing stopper layer 16 has a sufficient film thickness that can function as a stopper in a chemical-mechanical polishing process performed later, for example, a film thickness of 50–200 nm.

Then, as shown in FIG. 3(a), a resist layer R1 having a specified pattern is formed over the polishing stopper layer 16. The resist layer R1 has an opening over a region where a trench 32 is formed.

Then, the polishing stopper layer 16 and the pad layer 14 are etched, using the resist layer R1 as a mask. The etching is conducted by, for example, a dry etching method.

Then, as shown in FIG. 3(b), the resist layer R1 is removed by an ashing procedure. Then, the epitaxial growth layer 12 is etched using the polishing stopper layer 16 as a mask to form a trench 32. The depth of the trench 32 may vary depending upon the design of the device, but may be 300–500 nm, for example. The epitaxial growth layer 12 is etched by, for example, a dry etching. A taper angle a defined by the trench 32 is not particularly limited to any value, but may preferably be 75–85 degrees.

Then, as shown in FIG. 4(a), exposed surfaces of the epitaxial growth layer 12 in the trench 32 are oxidized by a thermal oxidation method, to thereby form a trench oxide film 34. The thermal oxidation may function to round and oxide the epitaxial growth layer 12. In other words, the epitaxial growth layer 12 at corner sections 32a (corner sections defined by the trench sidewalls and the trench bottom surface) of the trench 32, and corner sections 32b of protruded sections of the epitaxial growth layer 12 are preferably rounded. In certain embodiments, the temperature of the thermal oxidation is not limited to a particular range as long as the epitaxial growth layer 12 is rounded and oxidized, but may preferably be, for example, 700–1150° C., and more preferably 950–1150° C. The trench oxide film 34 has a film thickness of, for example, 10–100 μnm.

Then, as shown in FIG. 4(b), a dielectric layer 40 is formed over the surface of the substrate in a manner to embed the trench 32. The material of the dielectric layer 40 may be, for example, silicon oxide. The film thickness of the dielectric layer 40 may be any thickness that embeds the trench 32 and preferably at least covers the polishing stopper layer 16, for example, the thickness may be 500–800 nm. The dielectric layer 40 is preferably deposited by a method that makes the film density to be 2.1 g/cm$^3$ or greater, and more preferably 2.3 g/cm$^3$ or greater. Such a method for depositing the dielectric layer 40 includes a high-density plasma CVD method. High-density plasma is plasma with its ion density being 1×10$^{11}$/cm$^3$ or greater.

Then, as shown in FIG. 5(a), the dielectric layer 40 is planarized. The planarization is conducted until the polishing stopper layer 16 is exposed. In other words, the dielectric layer 40 is planarized, using the polishing stopper layer 16 as a stopper. The dielectric layer 40 is planarized by, for example, a chemical-mechanical polishing method.

Next, as shown in FIG. 5(b), the polishing stopper layer 16 is removed, using a heated phosphoric acid, for example. Then, as shown in FIG. 6(a), the pad layer 14 and upper portions of the dielectric layer 40 are isotropically etched.

Next, as shown in FIG. 6(b), a sacrificial oxide layer 20 is formed on exposed surfaces of the epitaxial growth layer 12 by a thermal oxidation method. The sacrificial oxide layer 20 may have a film thickness of 10–20 nm, for example.

Then, the dielectric layer 40 is subject to a thermal treatment. By thermally treating the dielectric layer 40, stresses in the dielectric layer 40 are released. As a result, the generation of cracks in the epitaxial growth layer, which may be caused by stresses of the dielectric layer 40, can be suppressed, and leaks can be suppressed. The thermal treatment is conducted at temperatures of 1050° C. or higher, and more preferably 1100° C. or higher. The generation of leaks can be securely prevented when the thermal treatment is conducted at temperatures of 1100° C. or higher. Also, the thermal treatment may preferably be conducted at temperatures of 1250° C. or lower in view of the heat resistance of the thermal treatment apparatus. The thermal treatment may be conducted in an inactive gas atmosphere, or an oxygen atmosphere. Preferably the thermal treatment may be conducted in an inactive gas atmosphere that includes oxygen gas in the range of 0.1 volume % to 10 volume %. The thermal treatment is preferably conducted for, for example, 20–120 minutes, and more preferably 40–80 minutes. In this manner, the trench isolation region 30 is formed. And after the thermal treatment, the film density of the dielectric layer is at least 2.1 g/cm$^3$, and more preferably 2.3 g/cm$^3$ or greater.

Next, as shown in FIG. 7(a), a resist layer R2 having a specified pattern is formed. The resist layer R2 defines an opening in a region that becomes an n-type well. An n-type impurity such as phosphorous and arsenic is implanted in the epitaxial growth layer 12 one or more times, using the resist layer R2 as a mask, to thereby form an n-type well 52 in the epitaxial growth layer 12. Subsequently, the resist layer R2 is removed.

Next, as shown in FIG. 7(b), a resist layer R3 having a specified pattern is formed. The resist layer R3 defines an opening in a region that becomes a p-type well. A p-type impurity such as boron is implanted in the epitaxial growth layer 12 once or plural times, using the resist layer R3 as a mask, to thereby form a p-type well 62 in the epitaxial growth layer 12. Subsequently, the resist layer R3 is removed.

Figure 8:
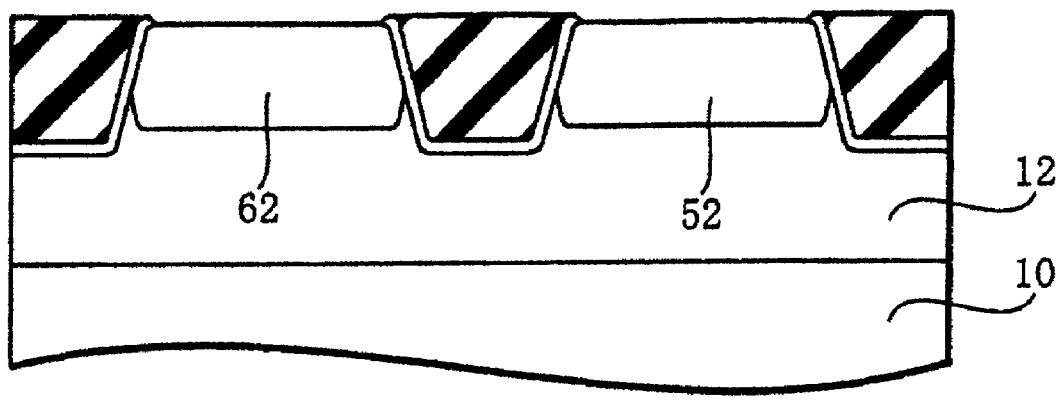
FIG. 8 schematically shows in cross section a step of manufacturing a semiconductor device in accordance with one embodiment of the present invention.

Then, as shown in FIG. 8, the sacrificial oxide film 20 and upper portions of the dielectric layer 40 are isotropically etched. Next, as shown in FIG. 1, a p-type MOS transistor 50 and an n-type MOS transistor 60 are formed in the respective element regions by a known method.

Certain embodiments may include one or more of the effects described below.

Certain embodiments of the present invention include a step of thermally treating the dielectric layer 40 at temperatures of 1050° C. or higher. Accordingly, stresses in the dielectric layer 40 with a high film density can be relieved. As a result, the generation of cracks in the epitaxial growth layer 12, which may be resulted from the dielectric layer 40, can be suppressed. Therefore, the generation of leaks is suppressed. Also, when the temperature of the thermal treatment is 1100° C. or higher, the generation of leaks can be inhibited or securely prevented.

It is noted that, if the dielectric layer is not thermally treated at all or treated at temperatures other than the temperatures described above, there is a tendency that cracks are generated in the epitaxial growth layer in the narrow trench due to stresses in the dielectric layer, and leaks are generated.

In certain embodiments, the thermal treatment step for the dielectric layer 40 is conducted before wells are formed. As a result, wells will not diffuse due to the thermal treatment of the dielectric layer 40.

The method embodiment described above is particularly useful in manufacturing a semiconductor device having a trench with a trench width being 0.35 μm or less, and more preferably 0.3 μm or less.

In certain embodiments, when the epitaxial growth layer 12 has a thickness of 2 μm or greater, the generation of negative influences on the semiconductor elements can be inhibited or securely prevented even when the impurity in the semiconductor substrate 10 diffuses into the epitaxial growth layer 12.

Differences in the generation of junction leaks have been examined for cases in which a dielectric layer that fills a trench is subject to a thermal treatment and for cases in which a thermal treatment is not conducted.

Figure 9:
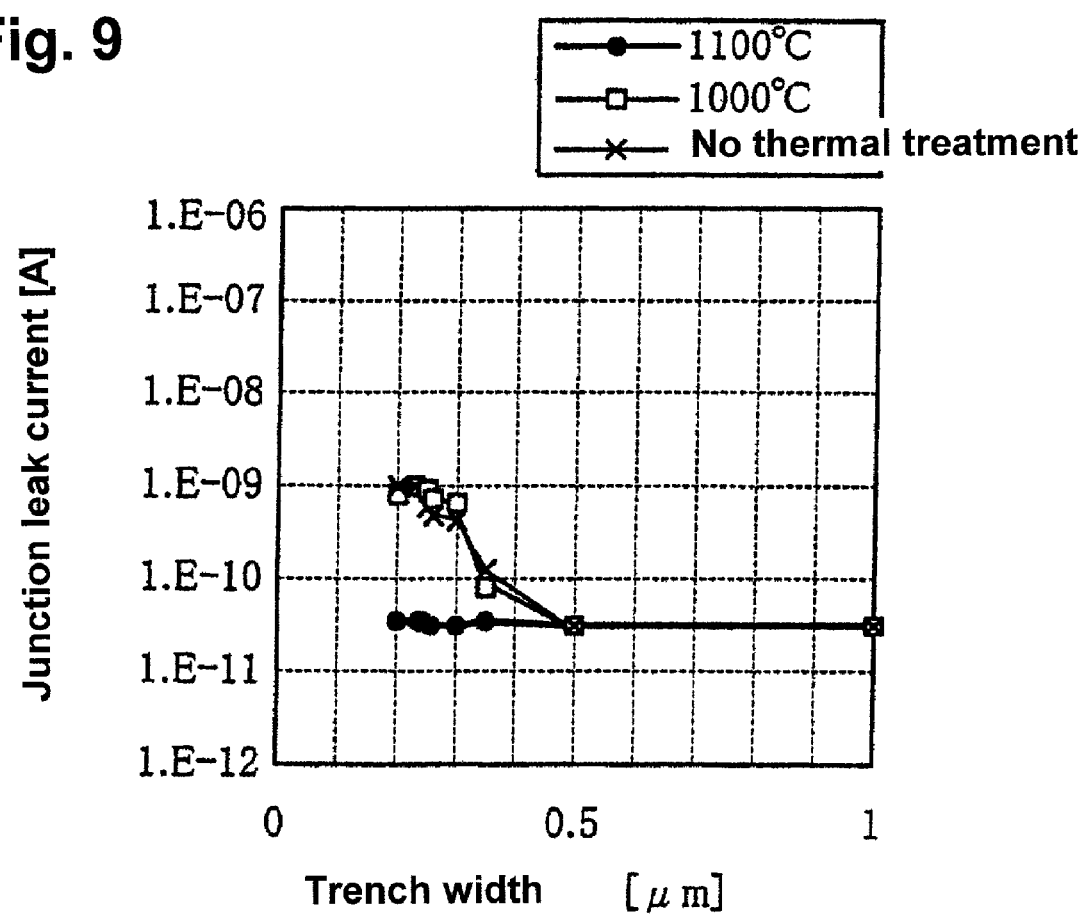
FIG. 9 is a graph showing relations between junction leak currents and trench widths in junctions between n-type impurity diffusion layers and p-type wells.

FIG. 9 is a graph showing relations between junction leak currents and trench widths in junctions between n-type impurity diffusion layers and p-type wells. It is noted that N+(P well) leaks are observed for the junction leak currents. In other words, electron leaks are observed. Also, a voltage applied to the semiconductor substrate with respect to the n-type impurity diffusion layer is −2.7 V.

Figure 10:
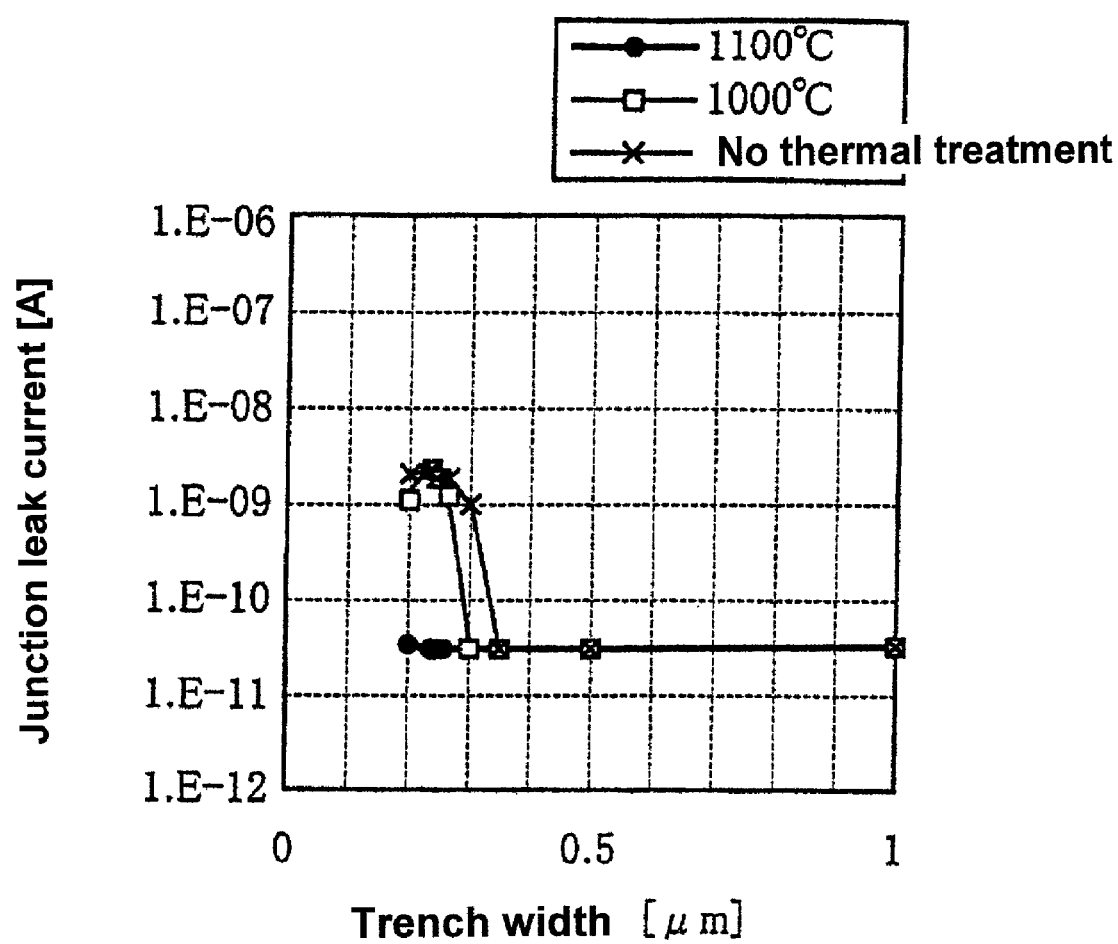
FIG. 10 is a graph showing relations between junction leak currents and trench widths in junctions between p-type impurity diffusion layers and n-type wells.

FIG. 10 is a graph showing relations between junction leak currents and trench widths injunctions between p-type impurity diffusion layers and n-type wells. It is noted that P+(N well) leaks are observed for the junction leak currents. In other words, hole leaks are observed. Also, a voltage applied to the semiconductor substrate with respect to the p-type impurity diffusion layer is −2.7 V.

It is noted that • marks indicate data obtained when the thermal treatment temperature is at 1100° C. □ marks indicate data obtained when the thermal treatment temperature is at 1000° C. x marks indicate data when the thermal treatment of the dielectric layer is not conducted. The trench width is a width at an upper section of the trench.

Test samples were manufactured according to the method embodiment described above. Processing conditions include the following. The dielectric layer was formed by a high-density plasma CVD method. The dielectric layer was thermally treated for 30 minutes in a nitrogen atmosphere under atmospheric pressure.

It is observed from FIG. 9 and FIG. 10 that, when the dielectric layer is not thermally treated, junction leak currents amount to levels on the order of 1E–10A, and junction leaks are generated when the trench widths become narrow (0.35 μm in FIG. 9, and 0.3 μm in FIG. 10). It is noted that the noise levels are on the order of 1E–11A. In contrast, when the dielectric layer is thermally treated at 1100° C., junction leak currents remain at levels on the order of 1E–11A (at noise levels), even when the trench width is narrow. In view of the above, it is understood that, when the dielectric layer is thermally treated at 1100° C. or higher, junction leaks are securely prevented.

It is also observed from FIG. 9 and FIG. 10 that, an increase in the junction leak current cannot be suppressed even when the dielectric layer is thermally treated if the thermal treatment temperature is at 1000° C.

The present invention is not limited to the embodiments described above, and many modifications can be made without departing from the subject matter of the present invention.

What is claimed is:

1. A method for manufacturing a semiconductor device including a trench isolation region, the method comprising:
   providing a semiconductor substrate having an epitaxial layer thereon;
   forming a pad layer on the epitaxial layer;
   forming a polishing stopper layer on the pad layer;
   forming at least one trench by etching the epitaxial layer while using at least the polishing stopper layer as a mask;
   forming a dielectric layer in and above the at least one trench;
   planarizing the dielectric layer using the polishing stopper layer as a stopper;
   etching the polishing stopper layer after planarizing the dielectric layer;
   etching the pad layer and exposing the epitaxial layer, after the etching the polishing stopper layer;
   forming a sacrificial oxide layer on the exposed epitaxial layer, wherein the sacrificial oxide layer consists of an oxide layer formed by thermally oxidizing the exposed epitaxial layer, after the removing the pad layer;
   wherein the sacrificial oxide layer is not formed on the dielectric layer;
   thermally treating the dielectric layer at a temperature of at least 1100° C. after the forming the sacrificial oxide layer;
   after the thermally treating the dielectric layer at a temperature of at least 1100° C., implanting impurity ions in the epitaxial layer; and
   after the implanting impurity ions, removing the entire sacrificial oxide layer and an upper portion of the dielectric layer using isotropic etching.

2. A method as in claim 1, wherein the thermally treating the dielectric layer is carried out in an atmosphere comprising 0.1 volume % to 10 volume % oxygen.

3. A method for manufacturing a semiconductor device having a trench isolation region according to claim 1, wherein the trench includes sidewall surfaces and a bottom surface, the method further comprising of thermally oxidizing the sidewall surfaces and the bottom surface of the trench to form a thermal oxide layer thereon, wherein the dielectric layer is formed in direct contact with the thermal oxide layer.

4. A method for manufacturing a semiconductor device having a trench isolation region according to claim 3, wherein the thermally oxidizing the sidewall surfaces and the bottom surface of the trench is carried out at a temperature in the range of at 700° C. to 1150° C.

5. A method for manufacturing a semiconductor device having a trench isolation region according to claim 3, wherein the thermally oxidizing the sidewall surfaces and the bottom surface of the trench is carried out at a temperature in the range of 950 to 1150 ° C.

6. A method for manufacturing a semiconductor device having a trench isolation region according to claim 3, wherein the thermally oxidizing the sidewall surfaces and the bottom surface yields an oxidation layer having a thickness in the range of 10 nm to 100 nm.

7. A method for manufacturing a semiconductor device having a trench isolation region according to claim 1, wherein the trench is formed with a trench width of no greater than 0.35 μm.

8. A method according to claim 1, further comprising forming a thermal oxide layer in the at least one trench prior to the forming a dielectric layer in and above the at least one trench.

9. A method according to claim 1, wherein the dielectric layer is formed with a film density of at least 2.1 g/cm$^3$.

10. A method according to claim 9, wherein the dielectric layer is formed by a high density plasma CVD method.

11. A method according to claim 1, wherein the epitaxial growth layer has a thickness of at least 2 μm.

12. A method as in claim 1, wherein the thermally treating the dielectric layer is carried out at a temperature in the range of 1100–1250° C.

* * * * *